United States Patent [19]
Matsuura

[11] Patent Number: 5,697,095
[45] Date of Patent: Dec. 9, 1997

[54] TUNER CAPABLE OF REDUCING POWER CONSUMPTION AND HEAT GENERATION

[75] Inventor: Syuuji Matsuura, Ikoma, Japan

[73] Assignee: Sharp Kabushiki Kaisha, Osaka, Japan

[21] Appl. No.: 447,250

[22] Filed: May 22, 1995

[30] Foreign Application Priority Data

Mar. 30, 1995 [JP] Japan ................... 7-072995

[51] Int. Cl.$^6$ ................... H04B 1/26; H03B 1/00
[52] U.S. Cl. ................... 455/338; 455/317; 455/319; 455/316; 331/77
[58] Field of Search ................... 455/316, 317, 455/318, 319, 320, 338; 331/74, 77, 117 R, 75

[56] References Cited

U.S. PATENT DOCUMENTS

| | | | |
|---|---|---|---|
| 3,051,932 | 8/1962 | Cressey et al. | 331/77 |
| 3,107,331 | 10/1963 | Barditch et al. | 455/320 |
| 3,823,380 | 7/1974 | Young | 455/319 |
| 4,731,875 | 3/1988 | Mizukami et al. | 455/318 |
| 4,928,314 | 5/1990 | Grandfield et al. | 455/319 |
| 5,107,228 | 4/1992 | Pham et al. | 331/117 R |
| 5,481,227 | 1/1996 | Komori et al. | 455/318 |

*Primary Examiner*—Curtis Kuntz
*Assistant Examiner*—Sam Bhattacharya

[57] ABSTRACT

There is provided a tuner capable of improving reliability thereof with reduced power consumption and reduced heat generation. In the tuner, one wideband amplifier circuit including one transistor constitutes a buffer amplifier. The wideband amplifier circuit is coupled with a first local oscillator circuit in a DC coupling style. With the above-mentioned arrangement, the buffer amplifier is allowed to have a simplified circuit construction and reduce noises. Since the amplifier circuit and the local oscillator circuit are coupled with each other in a DC coupling style, reduced power consumption can be achieved.

5 Claims, 4 Drawing Sheets

BC1 : WIDEBAND AMPLIFIER CIRCUIT
OC1 : FIRST LOCAL OSCILLATOR CIRCUIT
$L_1$ : FIRST LOCAL OSCILLATION STRIP RESONANCE LINE
$L_2$ : OSCILLATION OUTPUT COUPLING CONDUCTOR
$L_3$ : TRIMMER

BC1 : WIDEBAND AMPLIFIER CIRCUIT

OC1 : FIRST LOCAL OSCILLATOR CIRCUIT $L_1$ : FIRST LOCAL OSCILLATION STRIP RESONANCE LINE $L_2$ : OSCILLATION OUTPUT COUPLING CONDUCTOR $L_3$ : TRIMMER

BA : BUFFER AMPLIFIER
CT1 : COMMON-COLLECTOR TYPE λ/2 TYPE OSILLATOR CIRCUIT
$L_{1A}$ : FIRST LOCAL OSCILLATION STRIP RESONANCE LINE
$L_{3A}$ : TRIMMER
$L_{2A}$ : OSCILLATION OUTPUT COUPLING CONDUCTOR

TUNER CAPABLE OF REDUCING POWER CONSUMPTION AND HEAT GENERATION

BACKGROUND OF THE INVENTION

1. Field of the Invention

The present invention relates to a tuner for use mainly in a set box which is a terminal of CATV (cable television), and in particular, to an up-down system tuner.

2. Description of the Prior Art

In recent years, CATV has attracted increasing attention as a core of multimedia, and accordingly, there have been performed numbers of experiments for promoting a service of integrating communication with broadcasting through CATV systems in many countries, particularly in United States. Under such circumstances, there is a growing trend of developing the CATV system by upgrading functions of a set top box that is a terminal of the CATV system so that the system can receive particularly a digital broadcasting signal.

Conventionally, as a tuner for use in such a set box, there has been a tuner as shown in FIG. 5. The tuner has an input terminal 51, a filter circuit 52, a wideband variable attenuator 53, a wideband amplifier 54, a first mixer 56, a buffer amplifier 57, a voltage controlled oscillator 58, a first band-pass filter 59, a first intermediate-frequency amplifier 60, a second band-pass filter 61, a second mixer 62, a second intermediate-frequency amplifier 64, and an output terminal 65.

The block diagram shown in FIG. 5 includes a local oscillator Z comprised of the buffer amplifier 57 and the voltage controlled oscillator 58 as enclosed by dashed lines, and an electric circuit of the local oscillator Z is shown in FIG. 4. As shown in FIG. 4, the local oscillator Z includes a circuit BA constituting the buffer amplifier 57 and a circuit CT1 constituting the oscillator 58.

The circuit BA constituting the buffer amplifier 57 has transistor $Q_{2A}$ and $Q_{3A}$ as shown in FIG. 4. The circuit CT1 constituting the voltage controlled oscillator 58 is a common-collector type $\lambda/2$ type oscillator circuit CT1 which has a first local oscillation transistor $Q_{1A}$, feedback capacitances $C_{1A}$ and $C_{2A}$, bias resistors $R_{1A}$, $R_{2A}$, $R_{3A}$ and $R_{4A}$, a $\lambda/2$ strip line $L_{1A}$ constituting a resonance circuit, and a variable capacitance diode $D_{TA}$ for varying an oscillation frequency. The common-collector type $\lambda/2$ type oscillator circuit CT1 is a first local oscillator circuit. The oscillator circuit CT1 has resonance capacitances $C_{3A}$ and $C_{4A}$, a bias resistor $R_{13A}$ and a coil $L_{3A}$. The resonance capacitances $C_{3A}$ and $C_{4A}$ concurrently serve as resonance capacitances for the diode $D_{TA}$ and as matching capacitances for the oscillation transistor $Q_{1A}$. The resistor $R_{13A}$ is a tuning voltage supply bias resistor for the oscillation frequency variable capacitance diode $D_{TA}$. The coil $L_{3A}$ is a first local oscillation frequency varying trimmer. There is further provided a by-pass capacitor $C_F$.

A first local oscillation signal from the first local oscillator circuit (common-collector type $\lambda/2$ type oscillator circuit CT1) is induced from the $\lambda/2$ resonance line $L_{1A}$ to a coupling conductor $L_{2A}$ through inductive coupling. Then, a signal induced at the coupling conductor $L_{2A}$ is supplied from the coupling conductor $L_{2A}$ via a coupling capacitor $C_{5A}$ to the transistor $Q_{2A}$ included in the buffer amplifier 57 (buffer amplifier circuit BA).

Meanwhile, the buffer amplifier 57 including the transistors $Q_{2A}$ and $Q_{3A}$ has bias resistors $R_{6A}$, $R_{7A}$, $R_{8A}$, $R_{9A}$, $R_{10A}$, $R_{11A}$ and $R_{12A}$. Further, the buffer amplifier 57 has a resistor $R_{5A}$ and coils $L_{4A}$ and $L_{5A}$. The resistor $R_{5A}$ is a dumping resistor for preventing parasitic oscillation which possibly occurs when the oscillator circuit CT1 that is a local oscillator circuit and the buffer amplifier 57 are coupled with each other. The coils $L_{4A}$ and $L_{5A}$ are high-frequency choke coils.

A local oscillation signal outputted from the common-collector type $\lambda/2$ type oscillator circuit CT1 is supplied to the buffer amplifier 57 via the oscillation output induction coupling conductor $L_{2A}$. The above-mentioned signal is amplified by the transistor $Q_{2A}$ of the buffer amplifier 57 within an oscillation frequency range (normally 688 MHz to 1158 MHz). Then, the resulting signal is further amplified by a wideband amplifier circuit having the transistor $Q_{3A}$ in the next stage. An output of the wideband amplifier circuit is transmitted to a coupling capacitor $C_{8A}$ via a low-pass filter constituted by $L_{6A}$ and $C_{7A}$, and then outputted as an output signal having an output level of +15 dBm or more to a double-balance mixer in the next stage. Normally, the level of the oscillation output signal induced at the oscillation output coupling conductor $L_{2A}$ is at or around 0 dBm, and the buffer amplifier 57 constituted by the transistors $Q_{2A}$ and $Q_{3A}$ amplifies the above-mentioned signal by 15 dB or more.

In recent years, a CATV converter (setup converter) is often required to have a flat design because it is used by being mounted in a TV (television set) or a VTR (video tape recorder). Therefore, a tuner of the above-mentioned type has been required to have a compact low-height configuration capable of being used in an upright style. Therefore, under such circumstances, there is a problem that a great temperature rise results with heat generation if a power consumption is kept unimproved on the conventional level.

Generally, a power source of a tuner of a CATV converter is supplied with electricity when a TV signal is received, however, not supplied with electricity when the TV is not operating or in a standby state. In this regard, a significant temperature change occurs in the tuner between a case where the tuner is supplied with electricity and a case where the tuner is not supplied with electricity. Taking a temperature rise around the tuner, a temperature rise of +25° C. with respect to the ambient temperature results (when the power consumption of the tuner is about 2 W). Meanwhile, such a tuner is enclosed in a metal casing, and circuit parts are normally interconnected by solder on a printed circuit board and assembled in the casing. Consequently, when a great temperature difference takes place on the printed circuit board, a difference in quantity of thermal expansion between the metal portions and the laminate board constituting the printed circuit board increases, resulting in applying a stress to the solder. The stress possibly causes solder crack or promotes solder crack.

SUMMARY OF THE INVENTION

The object of the present invention is therefore to provide a tuner capable of improving the reliability thereof with reduced power consumption and reduced heat generation.

In order to achieve the aforementioned object, the present invention provides a tuner having a local oscillator for outputting a local oscillation signal to a mixer, wherein the local oscillator comprises: a buffer amplification section constituted by an amplifier circuit having one amplification stage; and a local oscillation section coupled with the buffer amplifier in a direct current coupling style.

In the tuner of the present invention, the buffer amplifier is constituted by an amplifier circuit having one amplification stage. With the above-mentioned arrangement, a circuit construction of the tuner can be achieved simpler than that of the prior art in which the buffer amplifier is constituted by an amplifier circuit having two amplification stages. The above-mentioned arrangement enables cost reduction and improved reliability of circuit operation. Furthermore, the amplifier circuit constituting the buffer amplifier is allowed to have one amplification stage, and therefore local noises generated from the buffer amplifier can be reduced.

Furthermore, in the tuner of the present invention, the buffer amplifier and the local oscillator are coupled with each other in a DC coupling style. With the above-mentioned arrangement, reduced power consumption smaller than that of the prior art can be achieved. Therefore, the above-mentioned arrangement is capable of suppressing a temperature change in the tuner, reducing an occurrence rate of solder crack due to thermal impact, and thereby enabling a high-reliability design.

In the tuner of an embodiment, the local oscillator is a common-base half-wavelength oscillator circuit. With the above-mentioned arrangement, an oscillation output greater than that of the conventional common-collector system can be achieved. Therefore, the local oscillator and the buffer amplifier can be easily coupled with each other. Therefore, the trouble of parasitic oscillation can be suppressed.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The present invention will be described in detail based on embodiments thereof with reference to the accompanying drawings.

Figure 1:
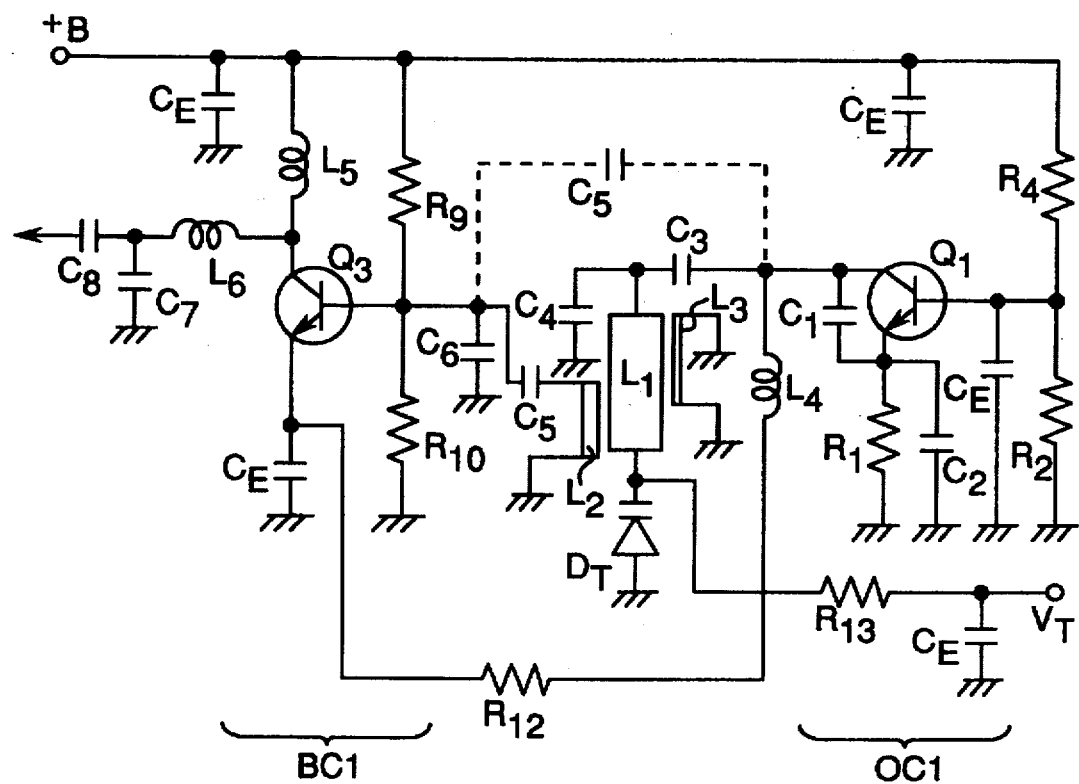
FIG. 1 is a circuit diagram of a tuner circuit according to an embodiment of the present invention.
Figure 5:
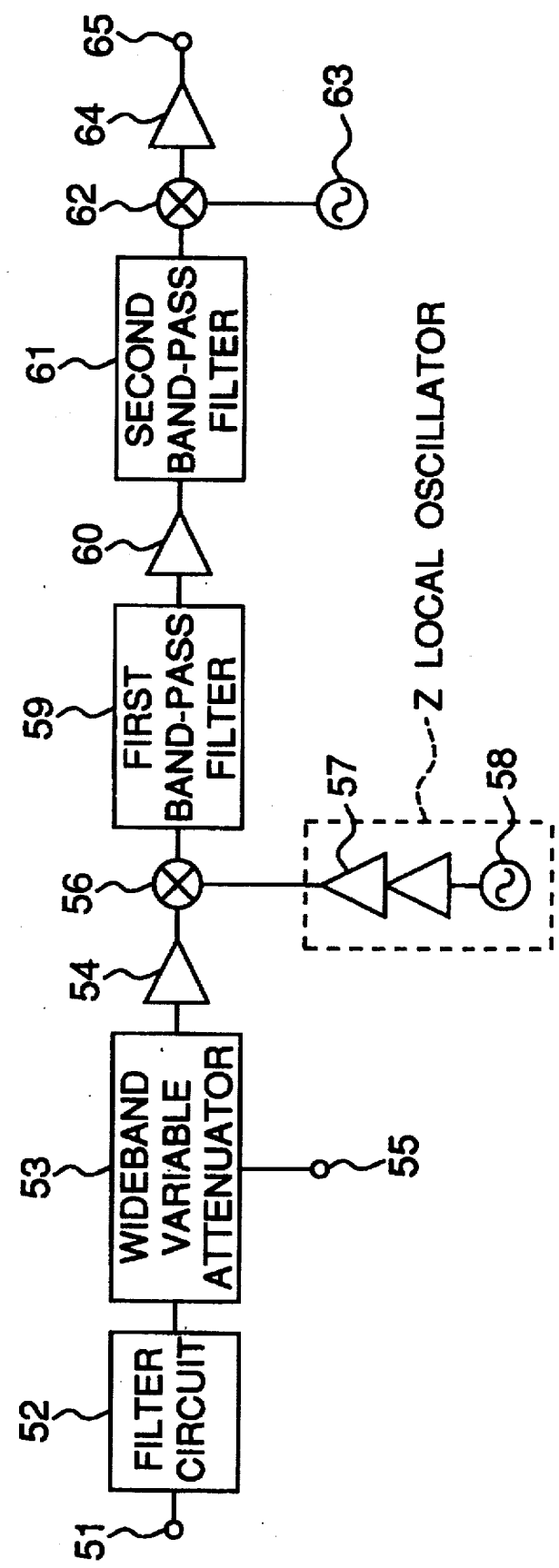
FIG. 5 is a block diagram of a prior art tuner.

FIG. 1 shows a local oscillator of a tuner according to an embodiment of the present invention. The tuner of the present embodiment has the same construction as that of the prior art tuner shown in FIG. 5 except for the local oscillator shown in FIG. 1, and therefore no description is provided therefor. The local oscillator of the present embodiment includes a first local oscillator circuit OC1 which is a common-base type $\lambda$(wavelength)/2 oscillator circuit and a wideband amplifier circuit BC1. The first local oscillator circuit OC1 has a first local oscillation transistor $Q_1$. The wideband amplifier circuit BC1 has a buffer amplification transistor $Q_3$. In FIG. 1, there are shown a supply power voltage +B, a by-pass capacitor $C_E$, coupling capacitors $C_5$ through $C_8$, resonance capacitances $C_3$ and $C_4$, feedback capacitances $C_1$ and $C_2$, and a first local oscillation strip resonance line $L_1$. In FIG. 1, there are further shown an oscillation output coupling conductor $L_2$ and a trimmer $L_3$. There are further shown choke coils $L_4$ through $L_5$, a matching coil $L_6$, a variable capacitance bias resistor $R_{13}$, a dumping resistor $R_{12}$, and bias resistors $R_1$ through $R_{10}$. There is also shown a variable capacitance diode $D_T$.

The first local oscillator circuit OC1 is a common-base type $\lambda/2$ (half-wavelength) oscillator circuit, and therefore a high negative resistance can be assured with respect to the resonance circuit side in comparison with the conventional common-collector system. Therefore, the first local oscillator circuit OC1 can normally assure an oscillation output higher than that of the conventional common-collector system. It is to be noted that device selection is important in order to increase the oscillation output. A first local oscillation output outputted from the first local oscillator circuit OC1 is induced through a capacitive coupling by way of the coupling capacitor $C_5$ or an inductive coupling by way of the oscillation output coupling conductor $L_2$, and then applied to the wideband amplifier circuit BC1. The transistor $Q_3$ of the wideband amplifier circuit BC1 amplifies the first local oscillation output in a first local oscillation frequency range (for example, 668 MHz to 1158 MHz) similarly to the prior art. Further, the wideband amplifier circuit BC1 yields an oscillation output of +15 dBm or more to a balance mixer circuit (not shown) in the next stage via the capacitor $C_8$. The capacitor $C_7$ and the coil $L_6$ of the wideband amplifier circuit BC1 constitute a matching circuit for the next stage and a low-pass filter. The low-pass filter removes a high-frequency component or a spurious component of the first local oscillation signal.

The transistor $Q_3$ is a buffer amplification transistor. A base current flows through the transistor $Q_3$ via bias resistors $R_9$ and $R_{10}$, and further a collector current flows as a bias current. The collector current as a bias current subjects the transistor $Q_3$ to a DC coupling with the collector of the transistor $Q_1$. The DC coupling is a coupling capable of allowing a DC component to pass. Meanwhile, a bias (bias current) for the transistor $Q_1$ is a collector current produced by a resistor $R_4$ and a resistor $R_2$. The magnitude of the collector current is determined by a resistor $R_1$. Therefore, the current from the transistor $Q_3$ to the transistor $Q_1$ determines the bias of the transistor $Q_1$.

The present embodiment employs a device having a gain-bandwidth product $f_T$ (bandwidth: 7 to 10 GHz) higher than that of the prior art as the device (transistor $Q_1$) constituting the first local oscillator circuit OC1. With the above-mentioned arrangement, an output level at an output terminal of the oscillation output coupling conductor $L_2$ of the first local oscillator circuit OC1 is set at +5 dBm to +6 dBm in the present embodiment. Meanwhile, a gain of the wideband amplifier circuit BC1 constituted by the transistor $Q_3$ is set at +10 dB to 12 dB. Therefore, the present embodiment can achieve an output level of +15 dBm or more, thereby allowing a buffer amplifier output on the same level as that of the prior art to be obtained.

Particularly in the present embodiment, same currents flow through both the devices (transistor $Q_1$ and transistor $Q_3$), and therefore, it is required to select a device having a relatively good current extendibility. The good current extendibility means that an $h_{FE}$ (DC current amplification factor) is great with respect to an identical $f_T$ (gain-bandwidth product). In the present embodiment, both the devices (transistor $Q_1$ and transistor $Q_3$) are each implemented by a device capable of obtaining satisfactory performance and stability at a current of 10 mA to 20 mA.

Figure 3:
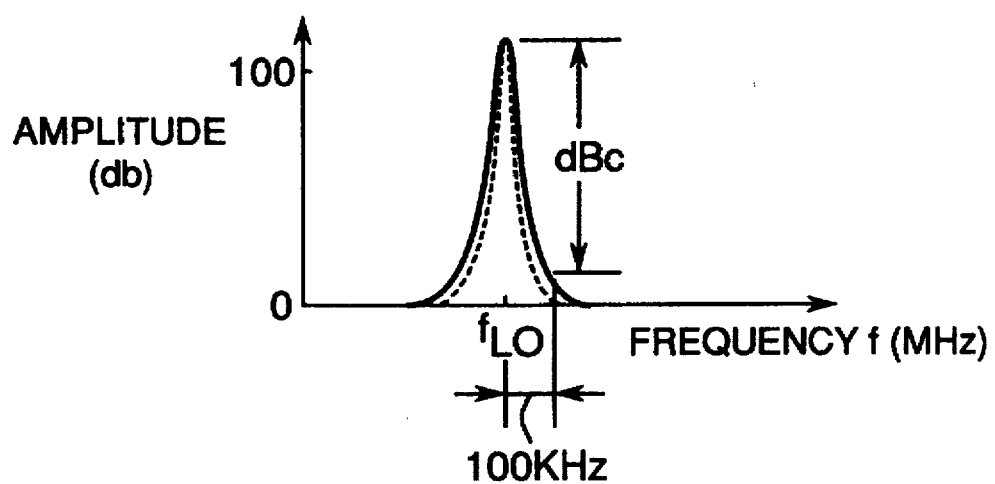
FIG. 3 is a graph showing a frequency characteristic of the embodiment shown in FIG. 1.
Figure 4:
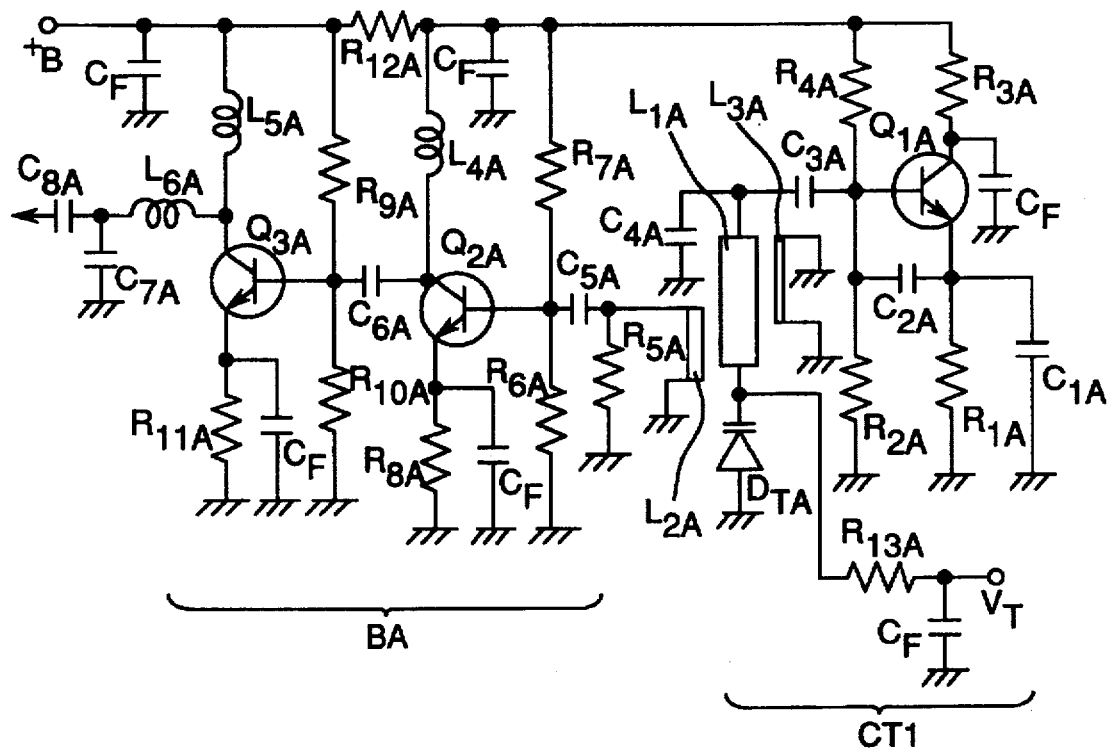
FIG. 4 is a circuit diagram of a prior art tuner circuit.

In the tuner having the above-mentioned construction, one wideband amplifier circuit BC1 comprised of one transistor $Q_3$ constitutes a buffer amplifier. Therefore, according to the present embodiment, a simplified circuit construction can be achieved in comparison with the prior art in which the buffer amplifier is constituted by an amplifier circuit having two amplification stages. Therefore, cost reduction can be achieved, and the reliability of the circuit operation can be improved. Furthermore, since the amplifier circuit constituting the buffer amplifier is allowed to have one amplification stage, local noises generated from the buffer amplifier can be reduced. Concretely, according to the present embodiment, as shown in FIG. 3, sideband noises were able to be reduced by changing a characteristic of the prior art indicated by a solid line to a characteristic as indicated by a dashed line at and around the local oscillation frequency $f_{LO}$. In other words, a reduction of amplitude in a frequency range of $f_{LO}$ to $f_{LO}+100$ kHz was able to be promoted from 100 dBc to 110 dBc.

Figure 2:
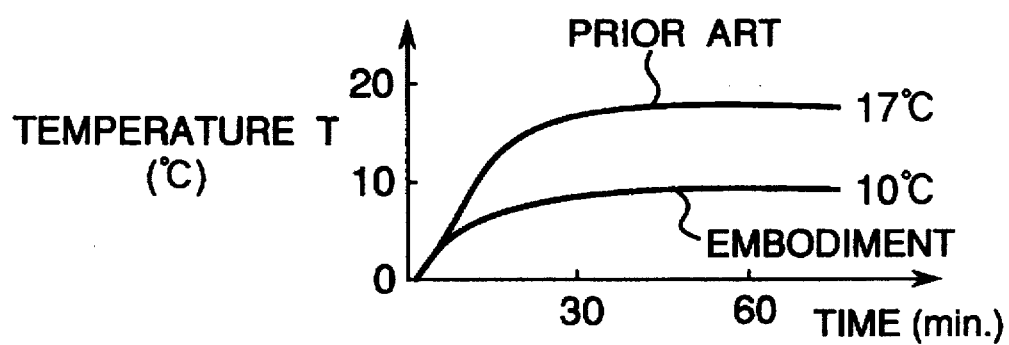
FIG. 2 is a graph showing a temperature rise characteristic of the embodiment shown in FIG. 1.

Furthermore, in the present tuner, the transistor $Q_3$ of the wideband amplifier circuit BC1 constituting the buffer amplifier and the transistor $Q_1$ of the first local oscillator circuit OC1 which is a local oscillation device are coupled with each other in a DC direct coupling style. Therefore, according to the tuner of the present embodiment, the power consumption of the tuner can be reduced to be smaller than that of the prior art. Concretely, in comparison with the prior art, the power consumption was able to be reduced by 40%. Therefore, according to the present embodiment, the temperature rise can be reduced by not less than 5° C., as compared with the prior art. Concretely, as shown in FIG. 2, a surface temperature of the tuner after an elapse a time of 60 minutes from when the power is turned on was able to be reduced to 10° C. smaller by 7° C. than 17° C. in the prior art. Thus, there were achievements of suppressing the temperature change in the tuner, remarkably reducing the occurrence rate of solder crack in a thermal impact test as compared with that of the prior art, and thereby enabling a high-reliability design.

Furthermore, since the oscillation power of the first local oscillator circuit OC1 is greater than that of the prior art, the first local oscillator circuit OC1 and the wideband amplifier circuit BC1 can be easily coupled with each other, so that the possible generation of parasitic oscillation can be suppressed.

As is apparent from the above description, according to the tuner of the present invention in which the buffer amplifier is constituted by an amplifier circuit having one amplification stage, a simplified circuit construction can be achieved in comparison with the prior art in which the buffer amplifier is constituted by an amplifier circuit having two amplification stages. Therefore, cost reduction can be achieved, and the reliability of the circuit operation can be improved. Furthermore, since the amplifier circuit constituting the buffer amplifier is allowed to have one amplification stage, local noises generated from the buffer amplifier can be reduced.

Furthermore, in the tuner of the present invention, the buffer amplifier and the local oscillation section are coupled with each other in a DC coupling style. Therefore, the power consumption can be reduced to be smaller than that of the prior art. The above-mentioned arrangement produces the effects of suppressing the temperature change in the tuner, remarkably reducing the occurrence rate of solder crack due to thermal impact, and thereby allowing a high-reliability design to be achieved.

Furthermore, according to the tuner of an embodiment of the present invention, the local oscillation section is a common-base half-wavelength oscillator circuit. Therefore, an oscillation output greater than that of the conventional common-collector system can be achieved. Therefore, the local oscillation section and the buffer amplification section can be easily coupled with each other. Therefore, the trouble of parasitic oscillation can be suppressed.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A tuner having a local oscillator for outputting a local oscillation signal to a mixer, wherein a local oscillator comprises:

a buffer amplification section constituted by an amplifier circuit having one amplification stage; and a local oscillation section coupled with the buffer amplifier in a direct current coupling style wherein the one amplification stage of said buffer amplification section consists of a first transistor having an emitter, and further wherein said local oscillation section includes a second transistor having a collector, said turner further comprising a connection branch connecting the emitter of the first transistor to the collector of the second transistor, thereby providing the direct current coupling.

2. A tuner as claimed in claim 1, wherein the local oscillation section has a common-base half-wavelength oscillator circuit.

3. A tuner as claimed in claim 1, wherein said connection branch includes a dumping resistor.

4. A tuner as claimed in claim 1, wherein each of said first and second transistors includes a base, said tuner further comprising a respective pair of resistors for biasing a DC base current for each base.

5. A tuner as claimed in claim 2, further comprising a local oscillation stripline conductor connected between the collector of said second transistor and ground.

* * * * *